(12) United States Patent
Bang et al.

(10) Patent No.: US 9,372,225 B2
(45) Date of Patent: Jun. 21, 2016

(54) STORAGE DEVICE TEST SYSTEM

(71) Applicant: Samsung Electronics Co., Ltd., Suwon-si (KR)

(72) Inventors: Kwang-kyu Bang, Hwaseong-si (KR); Min-gwon Moon, Hwaseong-si (KR); Il-do Seo, Suwon-si (KR); Yu-hyun Oh, Changwon-si (KR)

(73) Assignee: Samsung Electronics Co., Ltd. (KR)

( * ) Notice: Subject to any disclaimer, the term of this patent is extended or adjusted under 35 U.S.C. 154(b) by 266 days.

(21) Appl. No.: 13/941,669

(22) Filed: Jul. 15, 2013

(65) Prior Publication Data

US 2014/0021977 A1    Jan. 23, 2014

(30) Foreign Application Priority Data

Jul. 18, 2012    (KR) ................. 10-2012-0078389

(51) Int. Cl.
| | |
|---|---|
| *G01R 31/00* | (2006.01) |
| *G01R 31/28* | (2006.01) |
| *G06F 11/273* | (2006.01) |
| *G11C 29/56* | (2006.01) |

(52) U.S. Cl.
CPC ........ *G01R 31/2834* (2013.01); *G06F 11/2733* (2013.01); *G11C 29/56016* (2013.01)

(58) Field of Classification Search
None
See application file for complete search history.

(56) References Cited

U.S. PATENT DOCUMENTS

| | | | |
|---|---|---|---|
| 5,025,335 A * | 6/1991 | Stefansky | G11B 5/5526 360/137 |
| 7,743,292 B2 | 6/2010 | Jing et al. | |
| 7,958,405 B1 | 6/2011 | Chang | |
| 2003/0237032 A1 | 12/2003 | Adler et al. | |
| 2005/0193159 A1 | 9/2005 | Ng et al. | |
| 2006/0282724 A1 | 12/2006 | Roulo | |
| 2009/0075513 A1 * | 3/2009 | Amidon | H01R 13/6275 439/352 |
| 2009/0083486 A1 | 3/2009 | Chen et al. | |
| 2011/0246697 A1 | 10/2011 | Zhang | |

FOREIGN PATENT DOCUMENTS

| | | |
|---|---|---|
| JP | 2002-259068 | 9/2002 |
| JP | 2003-015966 | 1/2003 |
| JP | 2003-216509 | 7/2003 |
| JP | 2006-004075 | 1/2006 |
| KR | 20040054904 A | 6/2004 |
| KR | 20100114697 A | 10/2010 |

\* cited by examiner

*Primary Examiner* — Paresh Patel
(74) *Attorney, Agent, or Firm* — Myers Bigel & Sibley, P.A.

(57) ABSTRACT

A storage device test system includes: a storage device mounting unit configured to mount a storage device therein; a test control unit configured to transmit and/or receive test signals to and/or from the storage device; an interface plug that is electrically connected to the test control unit and coupled to the storage device mounted in the storage device mounting unit; and a plugging driving unit that controls a relative location between the interface plug and the storage device mounting unit. By using the storage device test system, the causes of defects that may occur while using a storage device may be easily detected.

20 Claims, 4 Drawing Sheets

STORAGE DEVICE TEST SYSTEM

CROSS-REFERENCE TO RELATED APPLICATIONS

This application claims the benefit of Korean Patent Application No. 10-2012-0078389, filed on Jul. 18, 2012, in the Korean Intellectual Property Office, the disclosure of which is incorporated herein in its entirety by reference.

BACKGROUND

Embodiments of the inventive concept relate to a storage device test system, and more particularly, to a storage device test system that accurately determines the causes of defects which may occur during the actual use of a storage device.

It is important for the success of a storage device product to detect the causes of defects in the process of developing the storage device product, such as a memory card, a hard disk drive, a solid state drive (SSD), or the like, and to find solutions to the causes of defects. However, since the possibility of recreating defects decreases as the degree of flawlessness in product development increases, it becomes increasingly difficult to find the causes of defects which may occur during the actual use of a storage device.

SUMMARY

Embodiments of the inventive concept provide a storage device test system that more accurately determines the causes of defects which may occur during the actual use of a storage device.

According to some embodiments of the inventive concept, a storage device test system may include: a storage device mounting unit configured to mount a storage device therein; a test control unit configured to transmit or receive test signals to or from the storage device; an interface plug that is electrically connected to the test control, unit and is capable of being coupled to the storage device mounted in the storage device mounting unit; and a plugging driving unit that controls a relative location between the interface plug and the storage device mounting unit.

According to some embodiments, the plugging driving unit may be configured to control a location of the interface plug, a location of the storage device mounting unit, or locations of both of them so that the interface plug is coupled to the storage device. The plugging driving unit may include: a plugging control unit; and a plugging actuator that controls a plug-in and an unplug of the interface plug according to a control signal of the plugging control unit. The plugging control unit and the test control unit may be implemented in the same computer system.

According to some embodiments, the plugging control unit may be configured to set a plug-in speed of the interface plug, an unplug speed of the interface plug, or both of them.

According to some embodiments, the plugging control unit may be configured to set a time interval between a plug-in of the interface plug and a subsequent unplug of the interface plug, a time interval between an unplug of the interface plug and a subsequent plug-in of the interface plug, or both of them.

According to some embodiments, the plugging control unit may be configured to unplug the interface plug from the storage device while a power supply, a signal, or data is supplied to the storage device. The plugging control unit may be configured to plug the interface plug into the storage device after unplugging the interface plug from the storage device, and the test control unit may be configured to examine whether a defect exists in the storage device when the plugging control unit plugs the interface plug into the storage device after unplugging the interface plug from the storage device. The test control unit may be configured to discontinue an additional operation of the storage device after outputting a defect message when a defect is detected in the storage device.

According to further embodiments, the storage device test system may further include a database unit that stores a data log record for the defect.

According to some embodiments, the plugging control unit and the test control unit may be implemented in a single computer control program, and the single computer control program may include a first thread including the test control unit and a second thread including the plugging control unit. The first thread and the second thread may be configured to be operated independently of each other. The computer control program may be configured so that a plurality of storage devices simultaneously may perform the same operation.

According to some embodiments, a storage device test system may include: a plurality of storage device mounting units each configured to mount a storage device therein; a test control unit configured to transmit or receive test signals to or from a plurality of storage devices mounted in the plurality of storage device mounting units; a plurality of interface plugs that are electrically connected to the test control unit and are capable of being coupled to the plurality of storage devices, respectively, mounted in the plurality of storage device mounting units; and a plurality of plugging driving units that control a relative location between each of the plurality of interface plugs and each of the plurality of storage device mounting units.

According to further embodiments, operations of the plurality of plugging driving units may be performed independently of each other.

According to other embodiments, the storage device test system may further include a switch box unit configured to supply power of different voltages to the plurality of storage devices according to a control signal of the test control unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
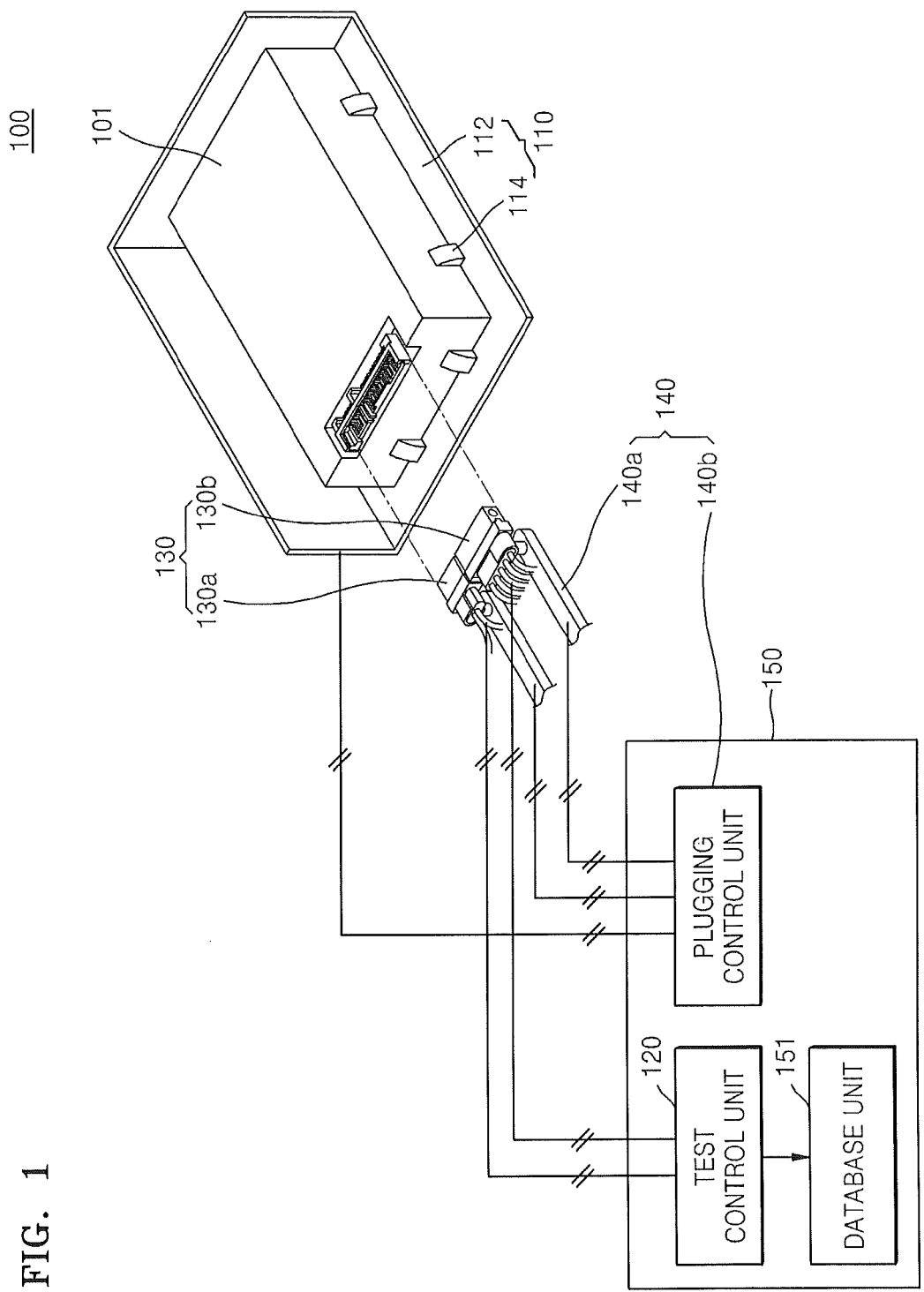
FIG. 1 is a schematic diagram conceptually illustrating a storage device test system according to various embodiments of the inventive concept.

As used herein, the term "and/or" includes any and all combinations of one or more of the associated listed items. Expressions such as "at least one of," when preceding a list of elements, modify the entire list of elements and do not modify the individual elements of the list.

Example embodiments of the inventive concept will be described more fully with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to one of ordinary skill in the art. In the drawings, the thicknesses of layers and regions and the sizes of components may be exaggerated for clarity. Furthermore, various elements and regions in the drawings are schematically shown. Accordingly, the inventive concept is not limited to relative sizes or intervals in the attached drawings.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram conceptually illustrating a storage device test system 100 according to some embodiments of the inventive concept. Referring to FIG. 1, the storage device test system 100 may include a storage device mounting unit 110 in which a storage device 101 may be mounted.

The storage device 101 may be a storage device, such as a solid state drive (SSD), a hard disk, a memory module, or a memory card. The storage device 101 may include terminals that are electrically connected to an external host and thus may receive a power supply voltage and may receive and output signals and/or data. The terminals may have a predetermined specification based on the standards of types of the storage device 101 and may be connected to internal circuits of the storage device 101. For example, the terminals may be terminals based on any one standard from among serial advanced technology architecture (SATA) having a maximum speed of 1.5 Gb/s, SATA2 having a maximum speed of 3 Gb/s, SATA3 having a maximum speed of 6 Gb/s, external SATA (eSATA), enhanced integrated drive electronics (E-IDE), small computer system interface (SCSI), serial-attached SCSI (SA-SCSI), zero insertion force (ZIF) type, compact flash (CF) type, universal serial bus (USB), and Institute of Electrical and Electronic Engineers (IEEE) 1394. Although FIG. 1 illustrates a terminal interface having a standard of the SATA series, embodiments of the inventive concept are not limited thereto.

The storage device mounting unit 110 is configured to accommodate and to fix the storage device 101. More specifically, the storage device mounting unit 110 may include a frame 112 and a fastener 114. The frame 112 may form the whole framework of the storage device mounting unit 110. The fastener 114 may be configured to fix the storage device 101 that is mounted in the storage device mounting unit 110.

If the size of a storage device to be mounted in the storage device mounting unit 110 varies and storage devices of various sizes are selectively mounted in the storage device mounting unit 110, the fastener 114 may be configured to be relatively moved with respect to the frame 112. If the size of the storage device 101 to be mounted in the storage device mounting unit 110 is fixed, the fastener 114 may be configured to be disposed at a predetermined position on the frame 112 and to fix the storage device 101.

The fastener 114 may have a configuration for holding two opposite sides of the storage device 101. Alternatively, the fastener 114 may have a configuration for holding two opposite sides of the storage device 101 in cooperation with the frame 112. That is, the frame 112 may contact one side of the two opposite sides of the storage device 101 and the fastener 114 may contact the other side of the two opposite sides, and thus, the frame 112 and the fastener 114 may jointly hold the two opposite sides of the storage device 101.

The storage device test system 100 may include a test control unit 120 configured to transmit or receive test signals to or from the storage device 101. The test control unit 120 may be electrically connected to the storage device 101 through an interface plug 130. The interface plug 130 may include a signal plug 130a and a power supply plug 130b.

The test control unit 120 may operate differently according to a response to a signal transmitted to the storage device 101 through the interface plug 130. For example, the test control unit 120 may be configured to perform write tests and read tests by continuously transmitting or receiving signals and/or data to or from the storage device 101 in a state in which the signal plug 130a and power supply plug 130b of the interface plug 130 has been connected to the storage device 101 and any defect detection has not been performed.

In a state in which the signal plug 130a of the interface plug 130 has been separated from the storage device 101, there may not be a valid response of the storage device 101. Thus, the test control unit 120 may transmit a connection detection signal for testing whether the signal plug 130a has been connected to the storage device 101 again. In addition, the test control unit 120 may be configured to determine whether a defect exists in the storage device 101 when the test control unit 120 receives a response to the connection detection signal from the storage device 101. Operations of the above components are described in more detail below.

As described above, the interface plug 130 may include the signal plug 130a that may transmit or receive signals and/or data, and the power supply plug 130b that may supply a power supply voltage. The signal plug 130a and the power supply plug 130b may be formed in one body or may be formed to be separated from each other and to be independently moved. However, although the signal plug 130a and the power supply plug 130b may be separated from each other, the signal plug 130a and the power supply plug 130b may be formed to be dependently moved.

The interface plug 130 may be plugged into the storage device 101 and/or unplugged from the storage device 101 by a plugging driving unit 140. The plugging driving unit 140 may control a relative location between the storage device mounting unit 110, in which the storage device 101 is mounted, and the interface plug 130.

To plug the interface plug 130 into the storage device 101 and/or unplug the interface plug 130 from the storage device 101, the plugging driving unit 140 may include a plugging actuator 140a that changes the relative location between the storage device mounting unit 110 and the interface plug 130. In addition, the plugging driving unit 140 may include a plugging control unit 140b that may control the movement of the plugging actuator 140a.

The interface plug 130 may be fixed to the plugging driving unit 140, and more specifically, to the plugging actuator 140a. In the case where the signal plug 130a and power supply plug 130b of the interface plug 130 are configured to be separated from each other and to be independently moved, the plugging actuator 140a may be configured so that an operation of each of the signal plug 130a and power supply plug 130b may be controlled. In this case, the location of the interface plug 130 may be changed by the movement of the plugging actuator 140a.

Alternatively, the storage device mounting unit 110 may be fixed to the plugging driving unit 140, and more specifically, to the plugging actuator 140a. In this case, the location of the storage device mounting unit 110 may be changed by the movement of the plugging actuator 140a.

Furthermore, both the interface plug 130 and the storage device mounting unit 110 may be fixed to the plugging driving unit 140, and more specifically, to the plugging actuator 140a. In this case, the plugging actuator 140a may be configured to change a location of any one of or locations of both of the interface plug 130 and storage device mounting unit 110. Although in FIG. 1, the interface plug 130 is fixed to the plugging actuator 140a, embodiments of the inventive concept are not limited thereto.

According to some embodiments, the test control unit 120 and the plugging control unit 140b may be implemented in a single computer system 150. Furthermore, the test control unit 120 and the plugging control unit 140b may be implemented in a single computer control program. In this case, the computer control program may include a first thread, in which the test control unit 120 is implemented, and a second thread in which the plugging control unit 140b is implemented.

The first thread and the second thread may be configured to be executed independently of each other. In other words, an operation of testing the storage device 101, which is implemented by the test control unit 120, and an operation of controlling the motion of the plugging actuator 140a, which is implemented by the plugging control unit 140b, may be executed independently of each other.

Figure 2:
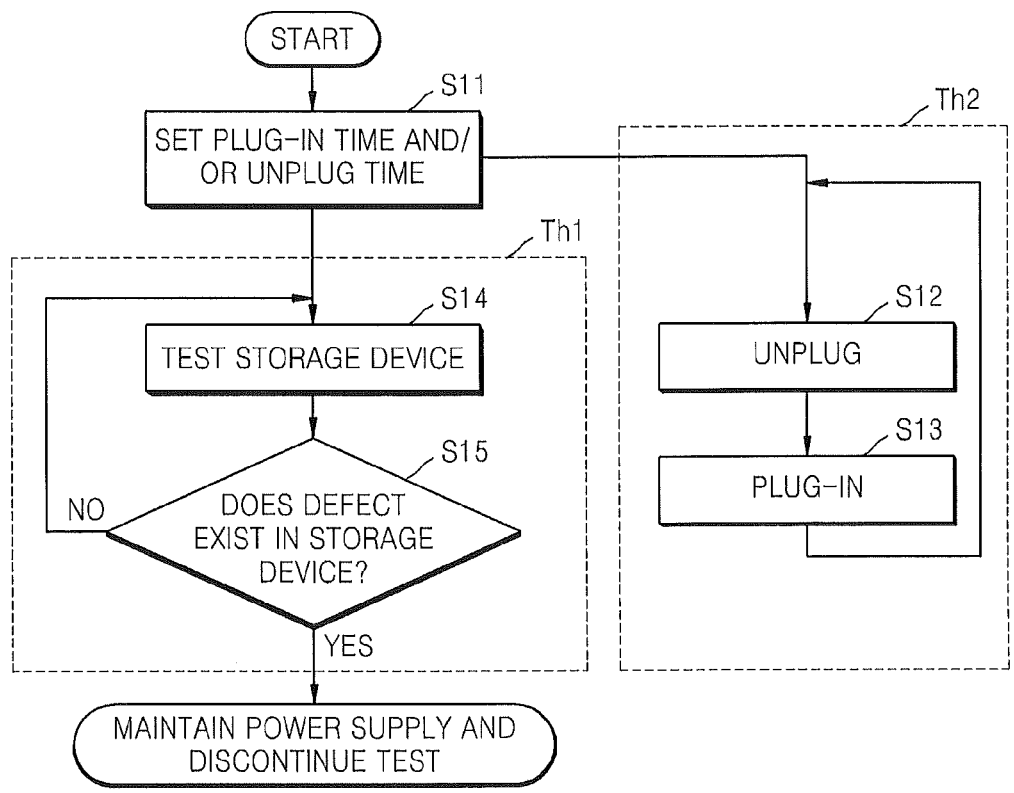
FIG. 2 is a flowchart for describing, in more detail, operations of a test control unit and plugging control unit of the storage device test system illustrated in FIG. 1 according to various embodiments.

FIG. 2 is a flowchart describing, in more detail, operations of the test control unit 120 and plugging control unit 140b of the storage device test system 100 illustrated in FIG. 1, according to some embodiments.

Referring to FIG. 2, a time interval between a plug-in and an unplug may be set (operation S11). That is, a time interval T1 between a plug-in and a subsequent unplug and a time interval T2 between an unplug and a subsequent plug-in may be set, and then T1 and T2 may be input to the plugging control unit 140b. For example, T1 and T2 may be set in the range of several microseconds (μs) to several minutes.

When T1 and T2 are determined, the plugging control unit 140b may control the motion of the plugging actuator 140a to operate the interface plug 130 according to T1 and T2 (operations S12 and S13). Although in FIG. 2, an unplug is first performed after the setting of T1 and T2, a plug-in may be first performed after the setting of T1 and T2. The unplug and the plug-in may be continuously repeated according to the set time intervals T1 and T2.

After the setting of T1 and T2, the test control unit 120 may continuously test the storage device 101 (operation S14). The test by the test control unit 120 may be a test for whether a defect exists in the storage device 101. Furthermore, the test by the test control unit 120 may be a test for whether writing and/or reading to/from the storage device 101 may be normally performed. Next, it is determined whether a defect exists in the storage device 101 (operation S15), and the test may be continuously repeated if a defect does not exist in the storage device 101. If a defect exists in the storage device 101, an additional test may be discontinued. However, in this case, the additional test may be discontinued while maintaining a power supply.

As shown in FIG. 2, a first thread Th1, which is performed by the test control unit 120, and a second thread (Th2), which is performed by the plugging control unit 140b, may be configured to operate independently of each other. In other words, the first and second threads Th1 and Th2 may be configured so that the progress of the first thread Th1 is not influenced by the progress conditions of the second thread Th2 and the progress of the second thread Th2 is not influenced by the progress conditions of the first thread Th1. The progress of the first thread Th1 may be determined according to what kind of signal it is that is responsive to a signal transmitted from the test control unit 120. In addition, the progress of the second thread Th2 may be carried out according to the initially set time intervals T1 and T2 only. By the above configuration, the test control unit 120 and the plugging control unit 140b may be operated with respective independent threads.

More specifically, the operation of the storage device test system 100 may start in a state in which the interface plug 130 is plugged in. In this case, in operation S14 of testing the storage device 101, when the interface plug 130 is unplugged (operation S12) after the set time interval T1 has passed while performing read and write tests for the storage device 101, the read and write tests for the storage device 101 stop. Since an unplug of the interface plug 130 is determined by the set time interval T1, the interface plug 130 may be unplugged while the test control unit 120 transmits/receives signals and/or data to/from the storage device 101.

In some embodiments, since the interface plug 130 is unplugged while the test control unit 120 transmits/receives signals and/or data to/from the storage device 101, a defect due to the unplug may occur in the storage device 101. In order to know whether a defect has occurred in the storage device 101 at this moment, the interface plug 130 needs to be plugged into the storage device 101 again.

Thus, when the interface plug 130 is plugged in after the set time interval T2 has passed, it may be tested whether a defect exists in the storage device 101 (operation S15). If a defect does not exist, the test control unit 120 may perform a predetermined test with respect to the storage device 101. If a defect exists, an additional operation of the storage device 101 may be discontinued after outputting a defect message. In addition, a data log record for the defect may be recorded in a database unit 151.

However, some embodiments of the inventive concept do not exclude a case in which the first thread Th1, which is performed by the test control unit 120, and the second thread Th2, which is performed by the plugging control unit 140b, operate with a mutual temporal relation therebetween.

The storage device test system 100 may test the storage device 101 under various conditions in relation to the plug-in and unplug of the interface plug 130. Embodiments of the storage device test system 100 that may perform a test through various changes of test conditions are described below.

As described above, the interface plug 130 may include the signal plug 130a and the power supply plug 130b, and the signal plug 130a and the power supply plug 130b may be configured to be actuated separately and independently from each other. In order for the signal plug 130a and the power supply plug 130b to be actuated separately and independently from each other, the plugging actuator 140a that implements a relative movement between the plugs 130a and 130b and the storage device 101 may be configured to take a corresponding separated and independent motion with respect to the signal plug 130a and the power supply plug 130b.

According to further embodiments, the plugging actuator 140a may be configured so that only the power supply plug 130b is unplugged from the storage device 101 while the signal plug 130a remains plugged into the storage device 101. On the contrary, the plugging actuator 140a may be configured so that only the signal plug 130a is unplugged from the storage device 101 while the power supply plug 130b remains plugged into the storage device 101. In addition, in these two cases, the plugging actuator 140a may be configured so that one plug remaining plugged in the storage device 101 is also unplugged from the storage device 101.

According to some embodiments, the plugging actuator 140a may be configured so that only the power supply plug 130b is plugged into the storage device 101 while the signal plug 130a remains unplugged from the storage device 101. On the contrary, the plugging actuator 140a may be configured so that only the signal plug 130a is plugged into the storage device 101 while the power supply plug 130b remains unplugged from the storage device 101. In addition, in these two cases, the plugging actuator 140a may be configured so that one plug remaining unplugged from the storage device 101 is also plugged into the storage device 101.

In some embodiments with a configuration described above with regards to the plug-in and the unplug, when both the signal plug 130a and the power supply plug 130b are plugged into the storage device 101, a test for examining whether a defect exists in the storage device 101 may be first performed. In this case, if it is determined that a defect exists in the storage device 101, an additional test and an operation of the plugging actuator 140a may be discontinued. In this case, the additional test and the operation of the plugging actuator 140a may be discontinued while maintaining a power supply.

In some embodiments, the plugging control unit 140b may be configured to set plug-in speed and/or time, unplug speed and/or time, or two or more of these speeds and/or times of the signal plug 130a and/or power supply plug 130b. Accordingly, the plugging actuator 140a may implement the plug-in and/or the unplug of the signal plug 130a and/or the power supply plug 130b according to the set plug-in speed and/or time, unplug speed and/or time, or two or more of these speeds and/or times.

In some embodiments with a configuration described above with regards to the speed and/or time of the plug-in and unplug, when both the signal plug 130a and the power supply plug 130b are plugged into the storage device 101, a test for examining whether a defect exists in the storage device 101 may be first performed. In this case, if it is determined that a defect exists in the storage device 101, an additional test and an operation of the plugging actuator 140a may be discontinued after a computer control program outputs a defect message. Also in this case, the additional test and the operation of the plugging actuator 140a may be discontinued while maintaining a power supply.

In some embodiments, in a state in which both the signal plug 130a and the power supply plug 130b are plugged into the storage device 101, only a power supply voltage that is supplied to the power supply plug 130b may be blocked and then the power supply voltage may be supplied to the power supply plug 130b again after a predetermined time T3 has passed. In this case, after supplying the power supply voltage again to the power supply plug 130b, a test for examining whether a defect exists in the storage device 101 may be first performed. In this case, if it is determined that a defect exists in the storage device 101, an additional test may be discontinued after the computer control program outputs a defect message.

By configuring the storage device test system 100 as described above, the causes of defects of various cases that may occur in the storage device 101 may be recreated identically with or similarly to actual circumstances. In particular, by testing the storage device 101 while changing the plug-in or unplug speed and/or time of the signal plug 130a and/or power supply plug 130b, a defect due to a mechanical factor may also be detected.

Figure 3:
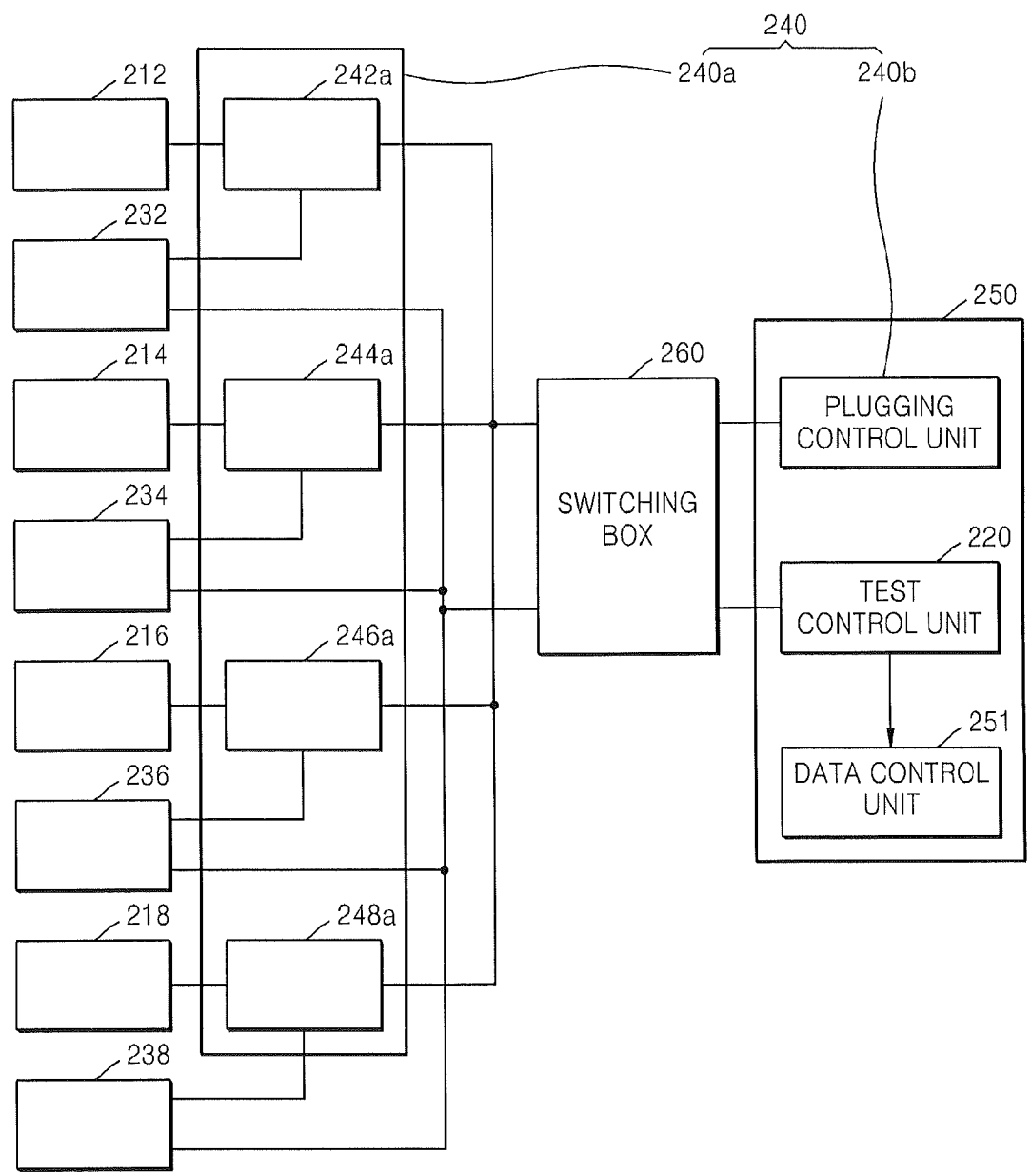
FIG. 3 is a schematic diagram conceptually illustrating a storage device test system according to various embodiments of the inventive concept.

FIG. 3 is a schematic diagram conceptually illustrating a storage device test system 200 according to some embodiments of the inventive concept.

Referring to FIG. 3, a plurality of storage device mounting units 212, 214, 216, and 218 and/or a plurality of interface plugs 232, 234, 236, and 238 may be operationally connected to a corresponding plurality of plugging actuators 242a, 244a, 246a, and 248a, respectively. According to some embodiments, only the storage device mounting units 212, 214, 216, and 218 may be physically connected to a corresponding one of the plugging actuators 242a, 244a, 246a, and 248a whereas the interface plugs 232, 234, 236, and 238 may not be physically connected to a corresponding one of the plugging actuators 242a, 244a, 246a, and 248a. According to other embodiments, only the interface plugs 232, 234, 236, and 238 may be physically connected to a corresponding one of the plugging actuators 242a, 244a, 246a, and 248a whereas the storage device mounting units 212, 214, 216, and 218 may not be physically connected to a corresponding one of the plugging actuators 242a, 244a, 246a, and 248a. According to other embodiments, both the storage device mounting units 212, 214, 216, and 218 and the interface plugs 232, 234, 236, and 238 may be connected to corresponding plugging actuators 242a, 244a, 246a, and 248a.

In some embodiments, the interface plugs 232, 234, 236, and 238 may be electrically connected to a test control unit 220. Since the plurality of interface plugs 232, 234, 236, and 238 are connected to the single test control unit 220, a switching box 260 for turning on or off connections therebetween may be interposed between the test control unit 220 and the plurality of interface plugs 232, 234, 236, and 238. The switching box 260 may play a role for distributing signals of the test control unit 220 to each of the interface plugs 232, 234, 236, and 238. Furthermore, the switching box 260 may play a role for supplying a suitable power supply voltage to a storage device to which each of the interface plugs 232, 234, 236, and 238 is connected. For example, the switching box 260 may be configured to selectively supply different power supply voltages of 5 volt and 12 volt to the interface plugs 232, 234, 236, and 238.

In some embodiments, the plugging actuators 242a, 244a, 246a, and 248a may be connected to the plugging control unit 240b. Since the plurality of plugging actuators 242a, 244a, 246a, and 248a are connected to the single plugging control unit 240b, the switching box 260 for turning on or off connections therebetween may be interposed between the plugging control unit 240b and the plurality of plugging actuators 242a, 244a, 246a, and 248a. The switching box 260 may play a role for distributing signals of the plugging control unit 240b to each of the plugging actuators 242a, 244a, 246a, and 248a. Accordingly, the plugging control unit 240b may control the motion of the plugging actuators 242a, 244a, 246a, and 248a. As in FIG. 1, the plugging actuators 242a, 244a, 246a, and 248a (240a) and the plugging control unit 240b may constitute a plugging driving unit 240.

As in FIG. 1, the plugging control unit 240b and the test control unit 220 may be implemented in a single computer system 250. In particular, the plugging control unit 240b and the test control unit 220 may be implemented in a single computer control program.

A computer control program installed in the computer system 250 may scan storage devices connected interposing the switching box 260. In addition, the computer control program may be configured to receive the time interval T1 and/or the time interval T2 with respect to each of the scanned storage devices. In addition, the computer control program may be configured so that plug-in speed and/or time and/or unplug speed and/or time may be designated with respect to each of the scanned storage devices.

The switching box 260 may be configured to select any one of the storage device mounting units 212, 214, 216, and 218, and any one of the plugging actuators 242a, 244a, 246a, and 248a and any one of the interface plugs 232, 234, 236, and 238, which correspond to the selected storage device mounting unit.

When the switching box 260 selects the interface plug 232 and the plugging actuator 242a, an operation therebetween may be simplified to the operation of the storage device test system 100, described with reference to FIG. 1. When the switching box 260 selects the interface plug 234 and the plugging actuator 244a, an operation therebetween may also be simplified in the same manner. Accordingly, an operation of the storage device test system 200 is not described.

When a defect is detected, an operation of the storage device may be discontinued after outputting a defect message. In this case, a data log record for the defect may be recorded in a database unit 251.

Although in FIG. 3, the storage device test system 200 includes four plugging actuators 242a, 244a, 246a, and 248a and four storage device mounting units 212, 214, 216, and 218, it will be understood that the storage device test system 200 may include more than or less than four plugging actuators and more than or less than four storage device mounting units.

Figure 4:
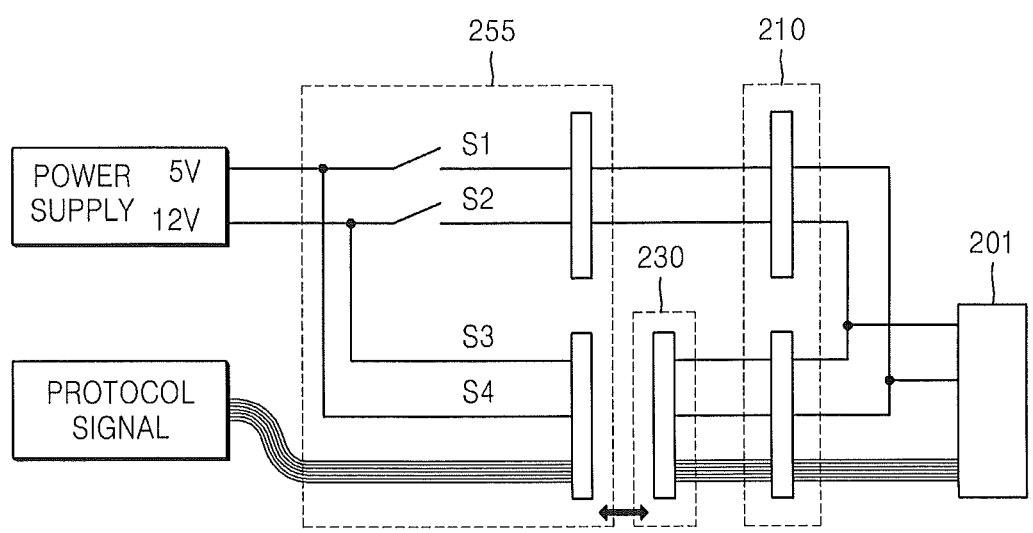
FIG. 4 is a conceptual diagram for describing an operation of testing a storage device by using a power supply and a protocol signal, based on an interface plug of FIG. 3 according to various embodiments.

FIG. 4 is a conceptual diagram for describing an operation of testing a storage device 201 by using a power supply and a protocol signal, according to some embodiments, based on the interface plugs 232, 234, 236, and 238 of FIG. 3.

Referring to FIG. 4, an interface plug 230 that is one of the interface plugs 232, 234, 236, and 238 may be configured to be attachable to or detachable from a base board 255 through a reciprocating motion. Switches S1, S2, S3, and S4 that may control the power supply may be disposed in the base board 255. Although FIG. 4 exemplifies 5 volts and 12 volts as the power supply, embodiments of the inventive concept are not limited thereto. First switches S1 and S2 of the switches S1, S2, S3, and S4 may independently control the supply of power to the storage device 201, and second switches S3 and S4 of the switches S1, S2, S3, and S4 may control the supply of power to the storage device 201 through the interface plug 230.

The interface plug 230 may be electrically connected to the test board 210. The test board 210 may be electrically connected to the storage device 201 to be tested.

The interface plug 230 may be electrically connected to and disconnected from the base board 255 independently. In this case, power supply lines and signal lines of the base board 255 may be connected to or disconnected from corresponding power supply lines and signal lines of the interface plug 230.

In order to test the control of the supply of power with respect to the storage device 201, a switch of the first switches S1 and S2 corresponding the voltage of power may be opened and the second switches S3 and S4 may be closed. When not testing the control of the supply of power with respect to the storage device 201, the first switches S1 and S2 may be all closed and the second switches S3 and S4 may be opened.

When testing the control of the protocol signal with respect to the storage device 201, the testing may be controlled by attaching the interface plug 230 to the base board 255 or detaching the interface plug 230 from the base board 255.

The above operations may be represented as the following table according to various embodiments.

TABLE 1

| Switch | | | | Interface | | | Protocol |
|---|---|---|---|---|---|---|---|
| S1 | S2 | S3 | S4 | Plug | 5 V | 12 V | Signal |
| O | O | X | X | O | O | O | O |
| X | X | O | O | O | O | O | O |
| X | O | X | X | O | X | O | O |
| O | X | X | X | O | O | X | O |
| X | X | X | X | O | X | X | O |
| O | O | X | X | X | O | O | X |
| X | O | X | X | X | X | O | X |
| O | X | X | X | X | O | X | X |
| X | X | O | O | X | X | X | X |

As described above, since it is possible to simultaneously test a plurality of storage devices by connecting the plurality of storage devices to the single computer system 250, there is a high possibility that the causes of defects having a low occurrence possibility are detected. Furthermore, since various test conditions may be set in advance, defects that are substantially the same as or very similar to those occurring in actual use environment may be detected.

While the inventive concept has been particularly shown and described with reference to exemplary embodiments thereof, it will be understood that various changes in form and details may be made therein without departing from the spirit and scope of the following claims.

What is claimed is:

1. A storage device test system comprising:
   a storage device mounting unit configured to mount a storage device therein;
   a test control unit configured to transmit and/or receive test signals to and/or from the storage device;
   an interface plug electrically connected to the test control unit and configured to be coupled to the storage device mounted in the storage device mounting unit; and
   a plugging driving unit that controls a location of the interface plug relative to the storage device mounting unit.

2. The storage device test system of claim 1, wherein the plugging driving unit is configured to control a location of the interface plug and/or a location of the storage device mounting unit such that the interface plug is coupled to the storage device.

3. The storage device test system of claim 2, wherein the plugging driving unit comprises:
   a plugging control unit; and
   a plugging actuator that controls a plug-in and an unplug of the interface plug according to a control signal of the plugging control unit.

4. The storage device test system of claim 3, wherein the plugging control unit and the test control unit are implemented in the same computer system.

5. The storage device test system of claim 3, wherein the plugging control unit is configured to set a plug-in speed of the interface plug and/or an unplug speed of the interface plug.

6. The storage device test system of claim 3, wherein the plugging control unit is configured to set a time interval between a plug-in of the interface plug and a subsequent unplug of the interface plug and/or a time interval between an unplug of the interface plug and a subsequent plug-in of the interface plug.

7. The storage device test system of claim 3, wherein the plugging control unit is configured to unplug the interface plug from the storage device while a power supply, a signal, and/or data is supplied to the storage device.

8. The storage device test system of claim 7, wherein the plugging control unit is configured to plug the interface plug into the storage device after unplugging the interface plug from the storage device, and the test control unit is configured to examine whether a defect exists in the storage device when the plugging control unit plugs the interface plug into the storage device after unplugging the interface plug from the storage device.

9. The storage device test system of claim 8, wherein the test control unit is configured to discontinue an additional operation of the storage device after outputting a defect message when a defect is detected in the storage device.

10. The storage device test system of claim 9, further comprising a database unit that stores a data log record for the defect.

11. The storage device test system of claim 3, wherein the plugging control unit and the test control unit are implemented in a single computer control program, and the single computer control program comprises a first thread comprising the test control unit and a second thread comprising the plugging control unit.

12. The storage device test system of claim 11, wherein the first thread and the second thread are configured to be operated independently of each other.

13. A storage device test system comprising:
   a plurality of storage device mounting units each configured to mount a storage device therein;
   a test control unit configured to transmit and/or receive test signals to and/or from a plurality of storage devices mounted in the plurality of storage device mounting units;
   a plurality of interface plugs that are electrically connected to the test control unit and configured to be coupled to the plurality of storage devices, respectively, mounted in the plurality of storage device mounting units; and
   a plurality of plugging driving units that control a location of each of the plurality of interface plugs relative to a respective storage device mounting unit of the plurality of storage device mounting units.

14. The storage device test system of claim 13, wherein operations of the plurality of plugging driving units are performed independently of each other.

15. The storage device test system of claim 13, further comprising a switch box unit configured to supply power of different voltages to the plurality of storage devices according to a control signal of the test control unit.

16. A storage device test system comprising:
   a test control unit configured to use test signals to test for defects in a storage device and defects in writing and/or reading to/from the storage device;
   an interface plug electrically connected to the test control unit and configured to be coupled to the storage device to transmit and/or receive the test signals to/from the storage device; and
   a plugging unit configured to move the interface plug to contact the storage device for plugging the interface plug into the storage device and for unplugging the interface plug from the storage device.

17. The storage device test system of claim 16, wherein the test control unit is configured to detect defects of a storage device when the interface plug is plugged into the storage device subsequent to being unplugged from the storage device.

18. The storage device test system of claim 17, wherein the plugging unit and the test control unit are implemented in a computer control program comprising a first test code for controlling the test control unit and a second test code for controlling the plugging unit, wherein the first and second test codes execute independently from each other.

19. The storage device test system of claim 17, wherein the plugging unit is further configured to:
   change a plug-in speed of the interface plug and/or an unplug speed of the interface plug; and
   set a time interval between a plug-in of the interface plug and a subsequent unplug of the interface plug and/or a time interval between an unplug of the interface plug and a subsequent plug-in of the interface plug.

20. The storage device test system of claim 16, wherein the interface plug comprises a test signal plug and a power supply plug, and wherein the plugging unit is further configured to unplug and plug the test signal plug while the power supply plug remains plugged in and/or unplug and plug the power supply plug while the test signal plug remains plugged in.

* * * * *